United States Patent
Vogt (10) Patent No.: US 8,964,443 B2
(45) Date of Patent: Feb. 24, 2015

(54) METHOD FOR IMPROVING BANDWIDTH IN STACKED MEMORY DEVICES

(71) Applicant: Peter D. Vogt, Boulder, CO (US)

(72) Inventor: Peter D. Vogt, Boulder, CO (US)

(73) Assignee: Intel Corporation, Santa Clara (*) Notice: Subject to any disclaimer, the term of this patent is extended or adjusted under 35 U.S.C. 154(b) by 0 days.

(21) Appl. No.: 13/913,628

(22) Filed: Jun. 10, 2013

(65) Prior Publication Data

US 2014/0362630 A1 Dec. 11, 2014

(51) Int. Cl.
*G11C 5/06* (2006.01)

(52) U.S. Cl.
CPC ...................... *G11C 5/066* (2013.01)
USPC .................. 365/63; 365/189.05; 365/189.04; 365/189.2; 365/51

(58) Field of Classification Search
CPC .......... G11C 5/04; G11C 5/06; G11C 7/1006; G11C 2029/4402; G11C 5/02; H01L 25/0657; H01L 25/18
USPC ................ 465/189.05, 63, 189.04, 189.2, 51; 365/189.05, 63, 189.04, 189.2, 51
See application file for complete search history.

(56) References Cited

U.S. PATENT DOCUMENTS

| | | |
|---|---|---|
| 8,437,164 B1 | 5/2013 | Law |
| 2006/0126369 A1 | 6/2006 | Raghuram |
| 2007/0070763 A1 | 3/2007 | Kim et al. |
| 2012/0011331 A1 | 1/2012 | Ware et al. |
| 2013/0021866 A1 | 1/2013 | Lee |
| 2013/0194854 A1* | 8/2013 | Shaeffer et al. ................. 365/63 |

OTHER PUBLICATIONS

International Search Report and Written Opinion received for PCT Patent Application No. PCT/US2014/039944, mailed on Sep. 25, 2014, 10 pages.

* cited by examiner

*Primary Examiner* — Thong Q Le
(74) *Attorney, Agent, or Firm* — Chapin IP Law, LLC (57) ABSTRACT

Apparatus and methods of increasing the data rate and bandwidth of system memory including stacked memory device dice. The system memory includes a memory device having a plurality of memory device dice in a stacked configuration, a memory controller coupled to the stacked memory device dice, and a partitioned data bus. The memory device dice each include one, two, or more groups of memory banks. By configuring each memory device die to deliver all of its bandwidth over a different single partition of the data channel, the system memory can achieve an increased data rate and bandwidth without significantly increasing costs over typical system memory configurations that include stacked memory device dice.

23 Claims, 9 Drawing Sheets

METHOD FOR IMPROVING BANDWIDTH IN STACKED MEMORY DEVICES

BACKGROUND

In recent years, memory device manufacturers have been fabricating memory devices in which two or more memory device dice are stacked one on top of the other, thereby increasing the uniformity while decreasing the lengths of the leads of the respective memory devices. For example, in a conventional fabrication process, such memory devices can each include a first memory device die and a second memory device die, the first memory device die being configured to be stacked on top of the second memory device die. Each of the first and second memory device dice may be implemented as a dynamic random access memory (DRAM), including one or more memory banks and associated transceivers and control/address logic. The memory devices may each further include a control/address bus having a specified number of control/address bits, a data bus having a specified number of data bits, and a plurality of channels corresponding to the control/address and data buses within each of the first and second memory device dice. In such memory devices, each of the first and second memory device dice can correspond to a separate memory rank, and the stacked first and second memory device dice can represent a two-rank memory stack having the same number of channels as one of the first and second memory device dice.

The memory devices described above can each be implemented within a system memory that includes a memory controller having a memory interface with control/address and data bus connections for interfacing with the control/address and data buses, respectively, of the memory device. Further, the data bus may be partitioned to interface with the number of channels within the respective first and second memory device dice, and the control/address bus may likewise be partitioned to interface with the control/address logic within the respective first and second memory device dice.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings:

FIG. 1b is a block diagram of the two-rank memory stack included in the memory device of FIG. 1a;

FIG. 2b is a block diagram of the stacked memory device dice included in the memory device of FIG. 2a;

FIG. 3 is a timing diagram illustrating an exemplary operation of the stacked memory device dice within the memory device of FIG. 2a;

FIG. 4 is a block diagram of an exemplary computer system incorporating the memory device and the memory controller of FIG. 2a;

FIG. 6 is a flow diagram of an exemplary method of operating the system memory of FIG. 2a.

DETAILED DESCRIPTION

Apparatus and methods of increasing the data rate and bandwidth of system memory including stacked memory device dice are disclosed. The system memory includes a memory device having a plurality of memory device dice in a stacked configuration, a memory controller coupled to the stacked memory device dice, and a partitioned data bus. The memory device dice each include one, two, or more groups of memory banks. By configuring each memory device die to deliver all of its bandwidth over a different single partition of the data channel, the system memory can achieve an increased data rate and bandwidth without significantly increasing costs over typical system memory configurations that include stacked memory device dice.

Throughout the detailed description of the present application, the following terminology will be used in accordance with the definitions set forth below. The term "stack" is used to refer to all memory device dice in a memory device taken together in one assembly. The term "slice" is used to refer to one memory device die in a stack of memory device dice. The term "channel" is used to refer to a set of physically discrete connections within a memory interface that independently control a partition of a memory device. The term "rank" is used to refer to multiple slices connected to a single channel in a multidrop fashion within a stack of memory device dice. The term "bandwidth" is used to refer to the maximum data transfer rate times the total data bus width of a memory device.

It is noted that each memory device die in a stack of memory device dice can be partitioned into odd memory banks and even memory banks that support specific overlapping activities. It is further noted that a memory interface can support four (4), eight (8), or any other suitable number of physical channels. Each channel can contain all of the control, data, and clock signals necessary to independently control a partition of a memory device. Each channel can have different memory pages open, can be independently clocked, and can be in different power states. The physical channel also includes input/output (I/O) power and ground signals.

Figure 1A:
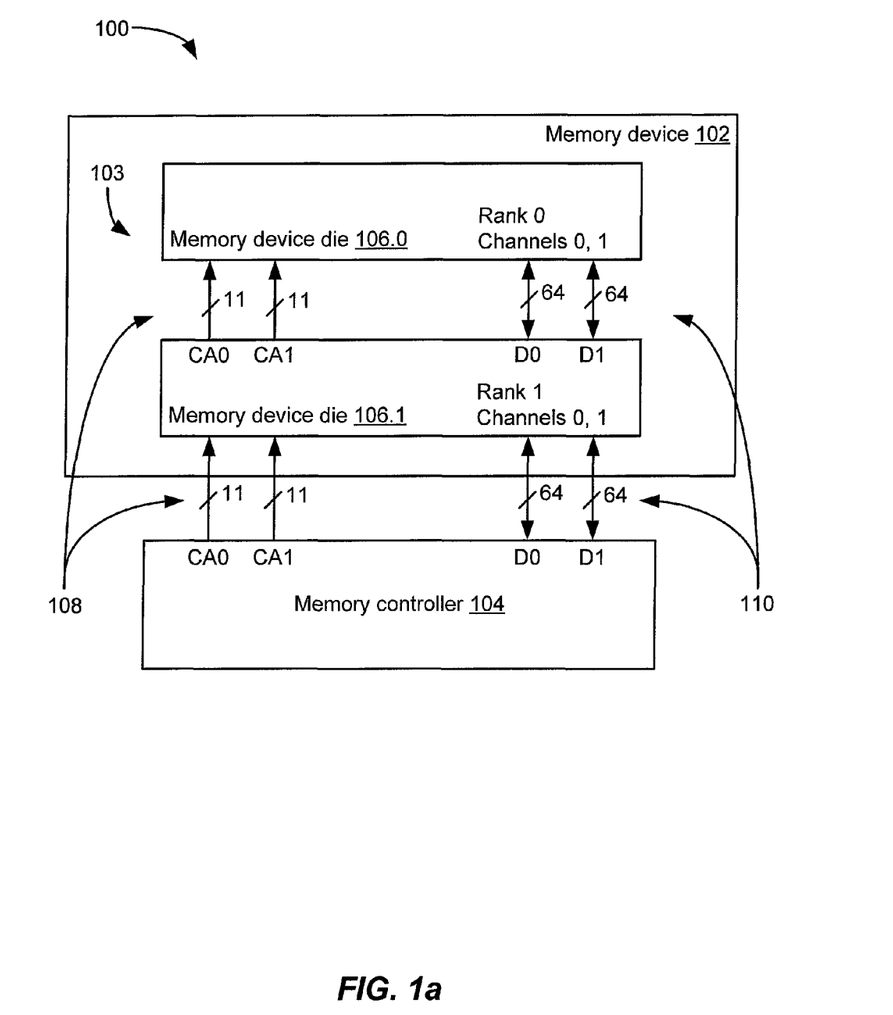
FIG. 1a is a block diagram of a system memory that includes a memory device having a two-rank memory stack, and a memory controller coupled to the two-rank memory stack.

FIG. 1a depicts a system memory 100 that includes a memory device 102 having a two-rank memory stack 103, and a memory controller 104 coupled to the two-rank memory stack 103. For example, the system memory 100 can be configured to conform to the Joint Electron Device Engineering Council (JEDEC) standard for Wide I/O mobile dynamic random access memory (DRAM), namely, JESD229 Wide I/O Single Data Rate (SDR), December 2011, or latest revision. As shown in FIG. 1a, the two-rank memory stack 103 includes a first memory device die 106.0 and a second memory device die 106.1, the first memory device die 106.0 being stacked on top of the second memory device die 106.1. For example, each of the memory device dice 106.0, 106.1 may be implemented as a dynamic random access memory (DRAM), a static random access memory (SRAM), or any other suitable memory. The system memory 100 further includes a control/address (CA) bus 108 having a specified number of CA bits (e.g., 11 CA0 bits+11 CA1 bits=22 CA bits, or any other suitable number of CA bits), and a data (D) bus 110 having a specified number of D bits (e.g., 64 D0 bits+64 D1 bits=128 D bits, or any other suitable number of D bits). In the memory device 102, the memory device dice 106.0, 106.1 can correspond to separate memory ranks 0, 1, respectively, and the memory device dice 106.0, 106.1 in a stacked configuration can represent the two-rank memory stack 103, which can have the same number of channels (e.g., 2 channels, or any other suitable number of channels) as one of the memory device dice 106.0, 106.1.

As further shown in FIG. 1*a*, the memory controller 104 has a memory interface with control/address (CA) and data (D) bus connections for interfacing with the control/address (CA) and data (D) buses 108, 110, respectively, of the system memory 100. The data (D) bus 110 may be partitioned into two 64-bit data channels D0, D1 to interface with the two channels 0, 1 of the two-rank memory stack 103, and the control/address (CA) bus 108 may be partitioned into two 11-bit control/address channels CA0, CA1 to interface with the control/address logic of the memory device dice 106.0, 106.1 within the two-rank memory stack 103. It is noted that the memory device dice 106.0, 106.1 may each have any other suitable number of data and/or control/address channels, having any other suitable number of data and/or control/address bits.

Figure 1B:
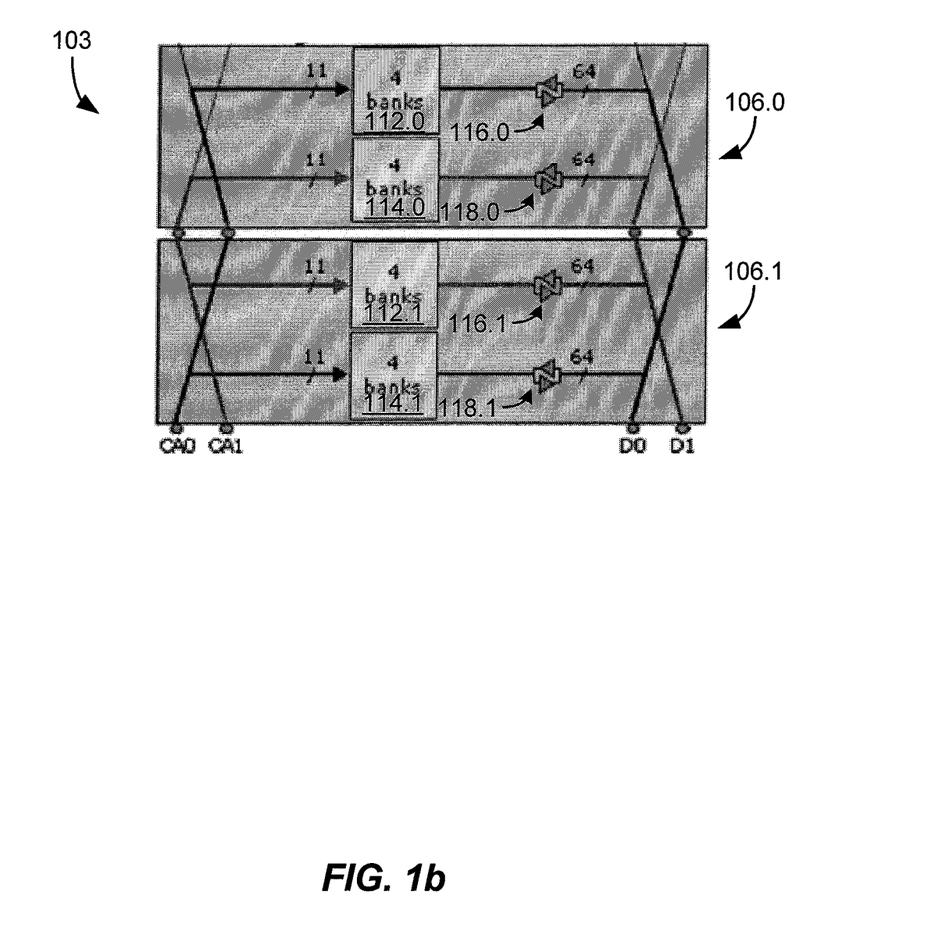

FIG. 1*b* depicts a detailed view of the two-rank memory stack 103 included in the memory device 102 of FIG. 1*a*. As shown in FIG. 1*b*, the two-rank memory stack 103 includes the first and second memory device dice 106.0, 106.1 in the stacked configuration. The memory device die 106.0 can include two groups of memory banks 112.0, 114.0, in which each group of memory banks 112.0, 114.0 can include four memory banks. Within the two-rank memory stack 103, the group of memory banks 112.0 is coupled to the 11-bit control/address channel CA0, and the group of memory banks 114.0 is coupled to the 11-bit control/address channel CAL The memory device die 106.0 further includes two transceivers 116.0, 118.0 for coupling the groups of memory banks 112.0, 114.0 to the 64-bit data channels D0, D1, respectively.

The memory device die 106.1 can likewise include two groups of memory banks 112.1, 114.1, in which each group of memory banks 112.1, 114.1 can include four memory banks. Within the two-rank memory stack 103, the group of memory banks 112.1 is coupled to the 11-bit control/address channel CA1, and the group of memory banks 114.1 is coupled to the 11-bit control/address channel CA0. The memory device die 106.1 further includes two transceivers 116.1, 118.1 for coupling the groups of memory banks 112.1, 114.1 to the 64-bit data channels D1, D0, respectively.

Accordingly, using the two pairs of transceivers 116.0, 118.0 and 116.1, 118.1, the respective memory device dice 106.0, 106.1 within the two-rank memory stack 103 of the system memory 100 can receive data provided by the memory controller 104 over the 64-bit data channels D0, D1, as well as drive data onto the 64-bit data channels D0, D1, in a point-to-two-point (P22P) configuration. In one embodiment, such a P22P configuration of the memory device dice 106.0, 106.1 can deliver, over the two 64-bit data channels D0, D1, a peak bandwidth of up to about 68 gigabytes (GB) per second (sec) with a reduced memory channel utilization due to its inherent rank-to-rank turnaround overhead.

Figure 2A:
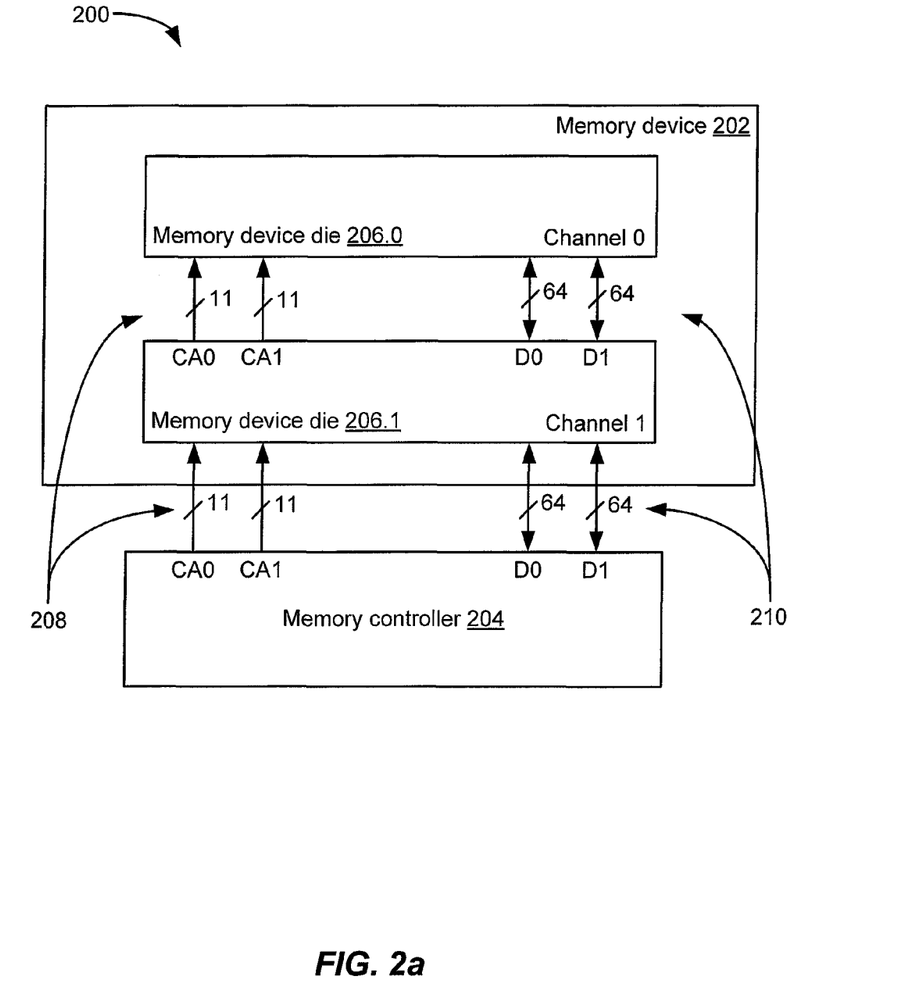
FIG. 2a is a block diagram of an exemplary system memory for increasing the data rate and bandwidth of the system memory of FIG. 1a, the exemplary system memory of FIG. 2a including a memory device having a plurality of stacked memory device dice, and a memory controller coupled to the stacked memory device dice, in accordance with the present application.

FIG. 2*a* depicts an exemplary system memory 200 for increasing the data rate and bandwidth of the system memory 100 of FIG. 1*a*, in accordance with the present application. As shown in FIG. 2*a*, the system memory 200 includes a memory device 202 having a plurality of memory device dice 206.0, 206.1 in a stacked configuration, and a memory controller 204 coupled to the stacked memory device dice 206.0, 206.1. For example, each of the memory device dice 206.0, 206.1 may be implemented as a dynamic random access memory (DRAM), a static random access memory (SRAM), or any other suitable memory. The system memory 200 further includes a control/address (CA) bus 208 having a specified number of CA bits (e.g., 11 CA0 bits+11 CA1 bits=22 CA bits, or any other suitable number of CA bits), and a data (D) bus 210 having a specified number of D bits (e.g., 64 D0 bits+64 D1 bits=128 D bits, or any other suitable number of D bits).

As further shown in FIG. 2*a*, the memory controller 204 has a memory interface with control/address (CA) and data (D) bus connections for interfacing with the control/address (CA) and data (D) buses 208, 210, respectively, of the system memory 200. The data (D) bus 210 may be partitioned into two 64-bit data channels D0, D1 to interface with two channels 0, 1 of the stacked memory device dice 206.0, 206.1, and the control/address (CA) bus 108 may be partitioned into two 11-bit control/address channels CA0, CA1 to interface with the control/address logic of the stacked memory device dice 206.0, 206.1. It is noted that the die-to-die connections of the 11-bit control/address channels CA0, CA1 and the 64-bit data channels D0, D1 may be made by any suitable bump fabrication process, as known to those of ordinary skill in the art. It is further noted that the memory device dice 206.0, 206.1 may each have any other suitable number of data and/or control/address channels, having any other suitable number of data and/or control/address bits.

Figure 2B:
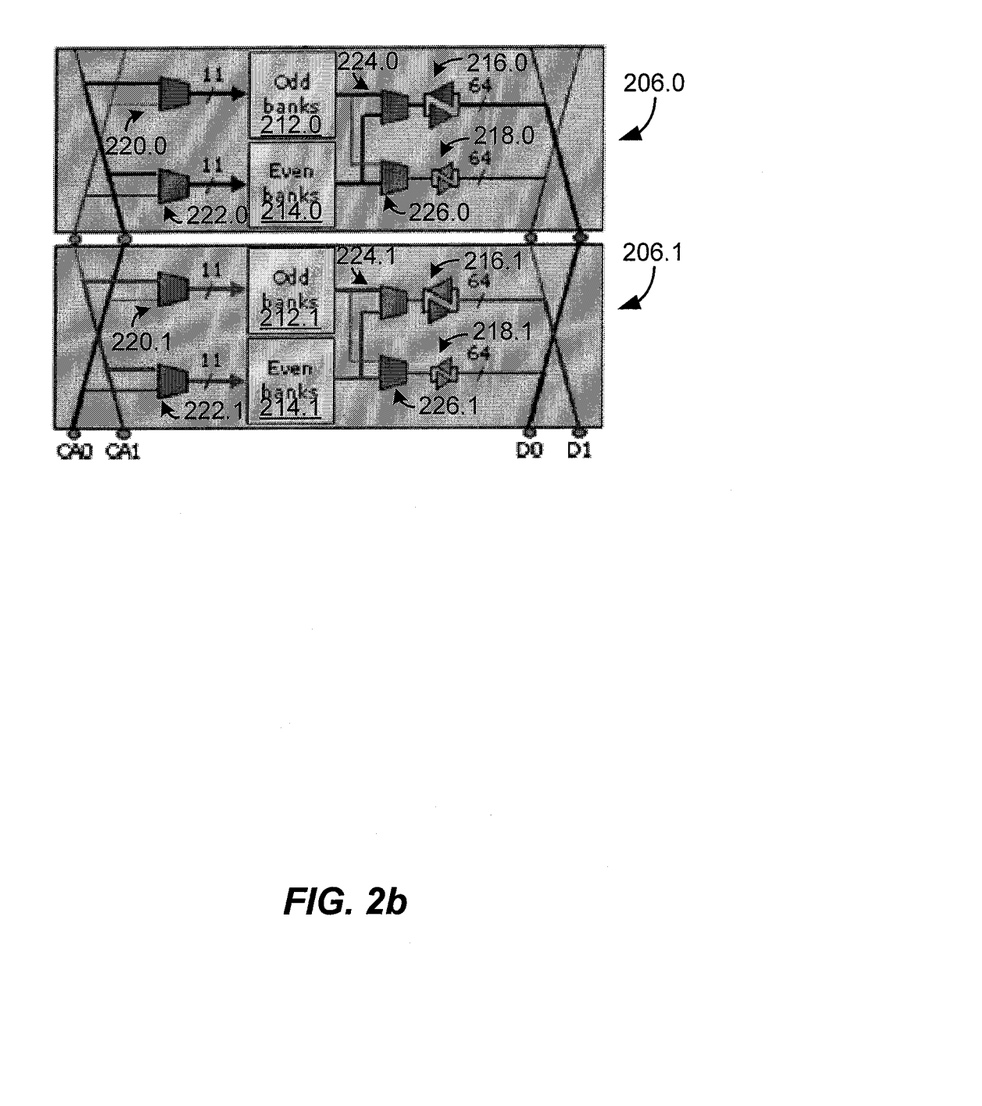

FIG. 2*b* depicts a detailed view of the stacked memory device dice 206.0, 206.1 included in the memory device 202 of FIG. 2*a*. As shown in FIG. 2*b*, the memory device die 206.0 can include one, two, or more groups of memory banks, such as a group of odd memory banks 212.0 and a group of even memory banks 214.0. The memory device die 206.0 further includes two transceivers 216.0, 218.0 coupled to the 64-bit data channels D0, D1, respectively. In addition, the memory device die 206.0 includes two multiplexers 220.0, 222.0 for selectively coupling the 11-bit control/address channels CA0, CA1 to the respective groups of odd and even memory banks 212.0, 214.0, and two multiplexers 224.0, 226.0 for selectively coupling the groups of odd and even memory banks 212.0, 214.0 to the transceivers 216.0, 218.0, respectively.

In the illustrated embodiment of the memory device die 206.0, the group of odd memory banks 212.0 is selectively coupled, by the multiplexer 220.0, to the 11-bit control/address channel CA0, and the group of even memory banks 214.0 is selectively coupled, by the multiplexer 222.0, to the 11-bit control/address channel CA0. The groups of odd and even memory banks 212.0, 214.0 are also each selectively coupled, by the multiplexer 224.0, to the transceiver 216.0, which, in turn, is coupled to the 64-bit data channel D0. In the illustrated embodiment, the multiplexer 226.0 is effectively deactivated, and therefore does not pass any data from the groups of odd and even memory banks 212.0, 214.0 to the transceiver 218.0, which, as described above, is coupled to the 64-bit data channel D1. The memory device die 206.0 is therefore configured to deliver all of its bandwidth over the single 64-bit data channel D0.

As further shown in FIG. 2*b*, the memory device die 206.1 can include one, two, or more groups of memory banks, such as a group of odd memory banks 212.1 and a group of even memory banks 214.1. The memory device die 206.1 further includes two transceivers 216.1, 218.1 coupled to the 64-bit data channels D1, D0, respectively. In addition, the memory device die 206.1 includes two multiplexers 220.1, 222.1 for selectively coupling the 11-bit control/address channels CA1, CA0 to the respective groups of odd and even memory banks 212.1, 214.1, and two multiplexers 224.1, 226.1 for selectively coupling the groups of odd and even memory banks 212.1, 214.1 to the transceivers 216.1, 218.1, respectively.

In the illustrated embodiment of the memory device die 206.1, the group of odd memory banks 212.1 is selectively coupled, by the multiplexer 220.1, to the 11-bit control/address channel CA1, and the group of even memory banks 214.1 is selectively coupled, by the multiplexer 222.1, to the 11-bit control/address channel CAL The groups of odd and even memory banks 212.1, 214.1 are also each selectively coupled, by the multiplexer 224.1, to the transceiver 216.1, which, in turn, is coupled to the 64-bit data channel D1. In the illustrated embodiment, the multiplexer 226.1 is effectively deactivated, and therefore does not pass any data from the groups of odd and even memory banks 212.1, 214.1 to the transceiver 218.1, which, as described above, is coupled to the 64-bit data channel D0. The memory device die 206.1 is therefore configured to deliver all of its bandwidth over the single 64-bit data channel D1.

Accordingly, using the multiplexer 224.0 and the transceiver 216.0, the memory device die 206.0 can receive data provided by the memory controller 204 over the 64-bit data channel D0, as well as drive data onto the single 64-bit data channel D0. Likewise, using the multiplexer 224.1 and the transceiver 216.1, the memory device die 206.1 can receive data provided by the memory controller 204 over the 64-bit data channel D1, as well as drive data onto the single 64-bit data channel D1. The memory device dice 206.0, 206.1 can therefore receive data over the respective 64-bit data channels D0, D1, and drive data onto the respective 64-bit data channels D0, D1, in a point-to-point (P2P) configuration.

In one embodiment, the P2P configuration of the memory device dice 206.0, 206.1 can deliver, over the respective 64-bit data channels D0, D1, a peak bandwidth of up to about 136 GB/sec, which is about twice the peak bandwidth (i.e., double the data rate and bandwidth) that can be delivered by the P22P configuration of the memory device dice 106.0, 106.1 within the system memory 100. The system memory 200 can achieve such an increased data rate and bandwidth with enhanced memory channel utilization by eliminating the rank-to-rank turnaround overhead of the system memory 100.

It is noted that, in order to support the double data rate (DDR) that can be delivered over the 64-bit data channel D0, the transceiver 216.0 can be configured such that its drive capacity is at least about twice that of the transceiver 218.0. Likewise, in order to support the DDR that can be delivered over the 64-bit data channel D1, the transceiver 216.1 can be configured such that its drive capacity is at least about twice that of the transceiver 218.1. The term "drive capacity" is used herein to refer to the capability of the transceivers 216.0, 218.0, 216.1, 218.1 to drive data onto the respective 64-bit data channels D0, D1 with the drive strength required to deliver the desired bandwidth for the P2P configuration of the memory device dice 206.0, 206.1.

Figure 3:
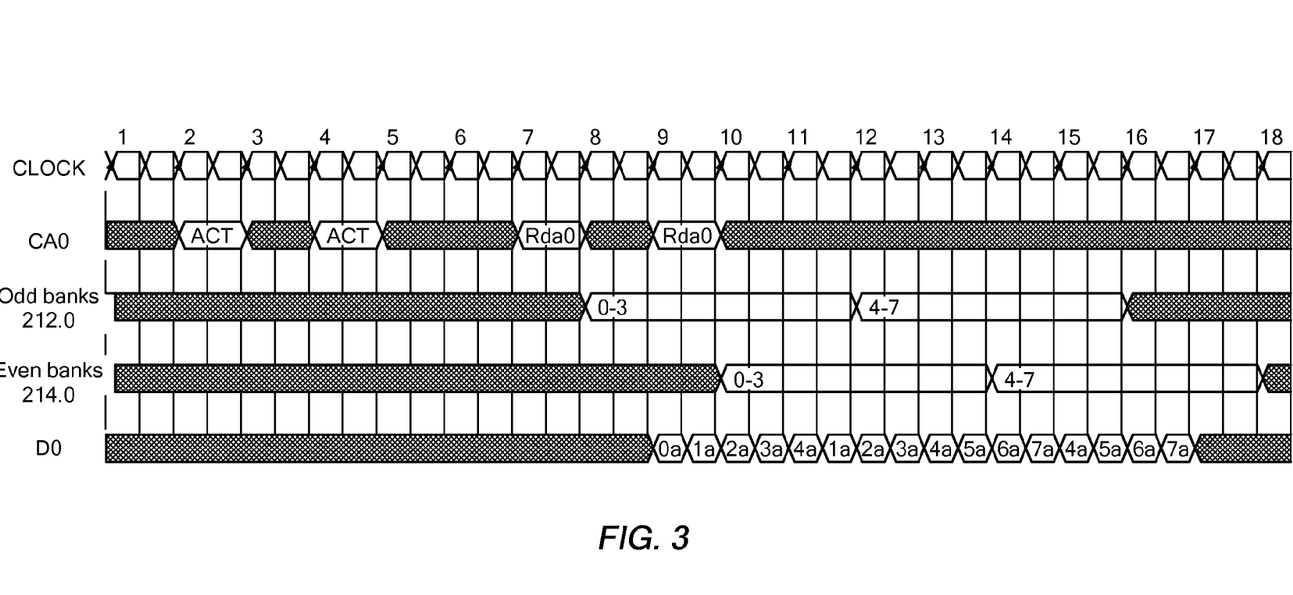

FIG. 3 depicts an exemplary timing diagram for delivering all of the bandwidth of the memory device die 206.0 over the single 64-bit data channel D0. It is noted that a similar timing diagram can be constructed to illustrate the delivery of all of the bandwidth of the memory device die 206.1 over the single 64-bit data channel D1. As shown in FIG. 3, address commands (ACT) can be provided over the 11-bit control/address channel CA0 during cycles 2 and 4 of a system clock (CLOCK) for addressing memory locations within the odd and even memory banks 212.0, 214.0, and control commands (Rda0, Rda1) can be provided over the 11-bit channel CA0 during cycles 7 and 9 of the CLOCK for reading data from the memory locations within the odd and even memory banks 212.0, 214.0. As further shown in FIG. 3, the odd memory bank 212.0 can provide its data bytes 0-3 from the addressed memory locations during cycles 8-11 of the CLOCK, and provide its data bytes 4-7 from the addressed memory locations during cycles 12-15 of the CLOCK. Likewise, the even memory bank 214.0 can provide its data bytes 0-3 from the addressed memory locations during cycles 10-13 of the CLOCK, and provide its data bytes 4-7 from the addressed memory locations during cycles 14-17 of the CLOCK. As described above, the groups of odd and even memory banks 212.0, 214.0 are each selectively coupled, by the multiplexer 224.0, to the transceiver 216.0, which, in turn, is coupled to the 64-bit data channel D0.

In one embodiment, the memory controller 204 is operative to control the multiplexer 224.0 so that the data (D0) bytes 0-3 from the odd memory bank 212.0, and the data (D0) bytes 0-3 from the even memory bank 214.0, are provided to the transceiver 216.0 in an alternating fashion, as illustrated by the data provided over the 64-bit data channel D0 during cycles 9-12 of the CLOCK. The memory controller 204 is further operative to control the multiplexer 224.0 so that the data (D0) bytes 4-7 from the odd memory bank 212.0, and the data (D0) bytes 4-7 from the even memory bank 214.0, are provided to the transceiver 216.0 in an alternating fashion, as illustrated by the data provided over the 64-bit data channel D0 during cycles 13-16 of the CLOCK. It is noted that, in the timing diagram of FIG. 3, the timing relationships between the data bytes 0-7 from the odd memory bank 212.0, the data bytes 0-7 from the even memory bank 214.0, as well as the alternating data bytes 0-3, 4-7 from the respective odd and even memory banks 212.0, 214.0, are compressed for ease of illustration. It is further noted that explicit illustrations of the control of the multiplexer 224.0 (and the multiplexer 224.1) by the memory controller 204 are omitted from FIG. 2b for purposes of clarity.

Figure 4:
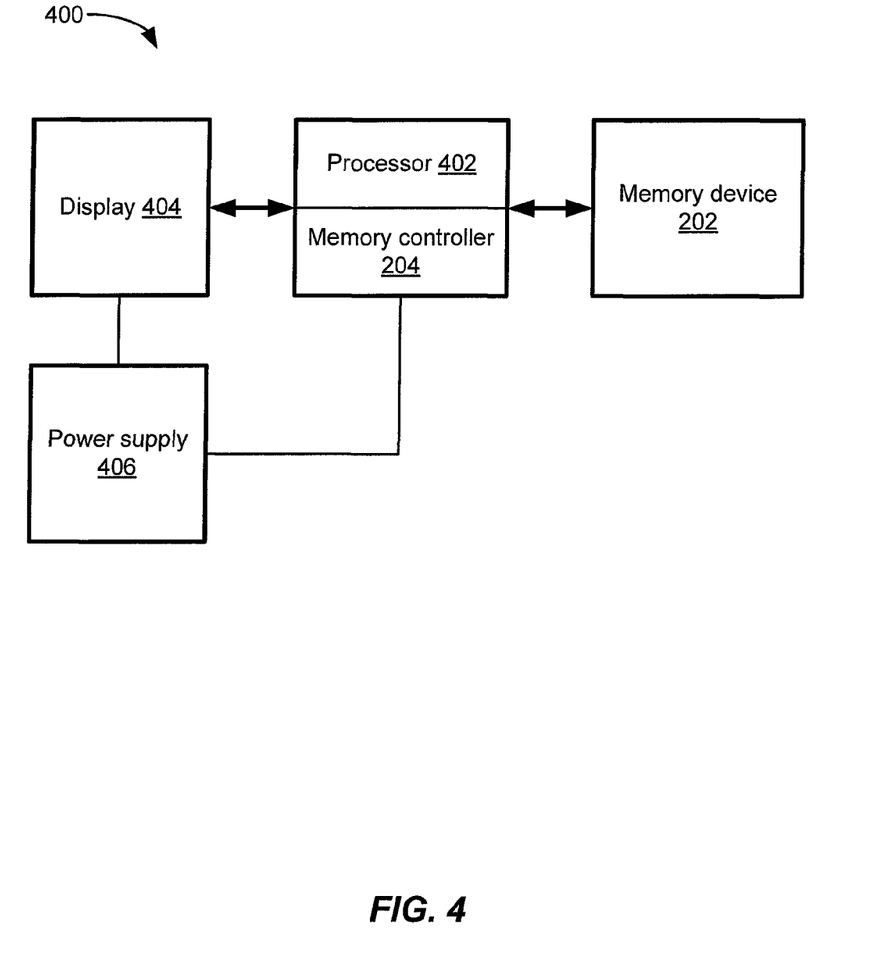

FIG. 4 depicts an exemplary computer system 400 that includes the memory device 202 and the memory controller 204 of FIG. 2a. As shown in FIG. 4, the computer system 400 further includes at least one processor 402 that incorporates the memory controller 204. In one embodiment, the processor 402 and the memory controller 204 can be implemented as separate devices. The processor/memory controller 402, 204 block is coupled to the system memory 202, and at least one peripheral device such as a display 404. The computer system 400 further includes a power supply 406 operative to supply suitable voltages to the processor/memory controller 402, 204 block and the display 404, as well as to the memory device 202 through the processor/memory controller 402, 204 block. For example, the computer system 400 can be any suitable type of resource such as a desktop computer, a laptop computer, a tablet computer, a mobile device, a smartphone, a cellular telephone, a camera, or any other suitable computer or computerized device that uses memory to store data.

The processor 402 is operative to execute instructions stored on at least one non-transitory storage medium, such as the memory device 202 or any other suitable storage medium, for performing various processes within the computer system 400, including one or more processes for controlling operations of the memory device 202 and/or any other suitable storage device. The memory device 202 can include one or more memory components such as a volatile or non-volatile memory, which may be implemented as SRAM, DRAM, or any other suitable volatile or non-volatile memory. The memory 202 can also be configured to store an operating system executable by the processor 402, and one or more applications that may be run by the operating system. In response to a request generated by one of the applications, the processor 402 in conjunction with the memory controller 204 can execute the operating system to perform data write/read operations on the memory device 202 and/or any other suitable storage device.

Figure 5A:
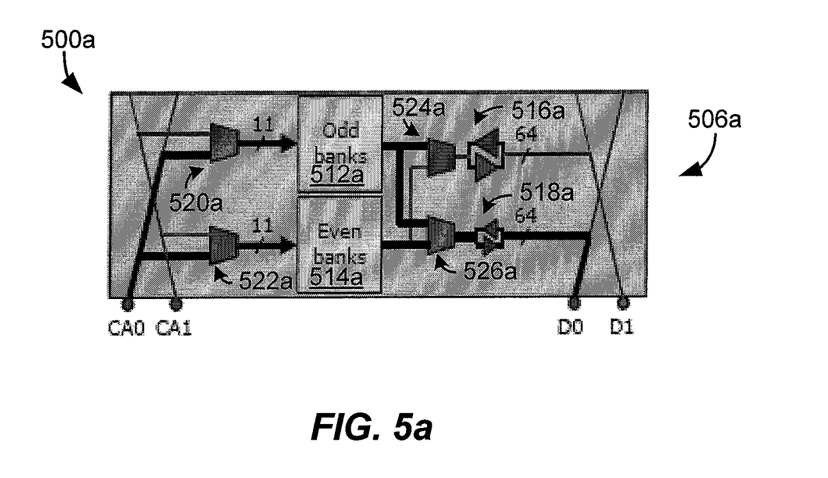
FIGS. 5a, 5b, and 5c are block diagrams of exemplary alternative embodiments of the stacked memory device dice of FIG. 2b.
Figure 5B:
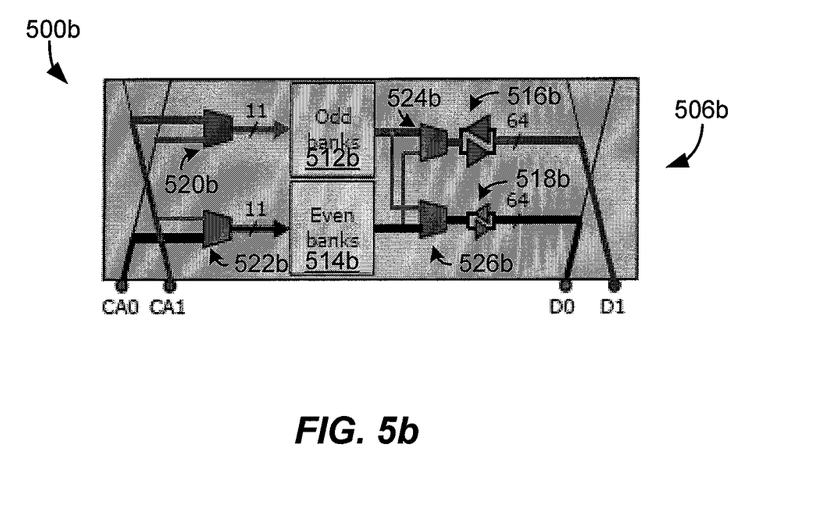
Figure 5C:
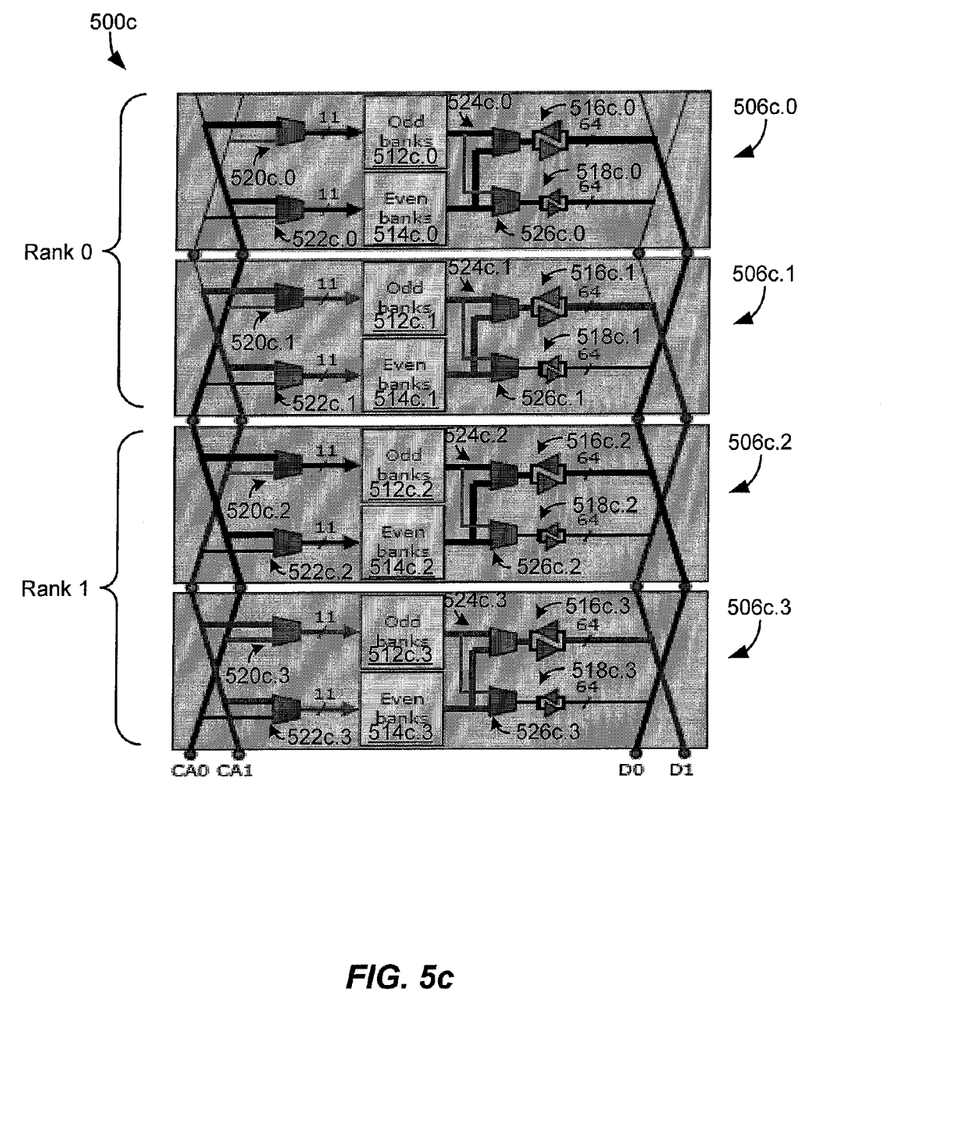

Having described the above exemplary embodiments of the disclosed apparatus and methods, other alternative embodiments or variations may be made. For example, FIGS. 5a, 5b, and 5c depict exemplary alternative embodiments 500a, 500b, 500c, respectively, of the memory device dice 206.0, 206.1 of FIG. 2b. As shown in FIG. 5a, the alternative embodiment 500a includes a single memory device die 506a having one, two, or more groups of memory banks, such as a group of odd memory banks 512a and a group of even memory banks 514a. The memory device die 506a further includes two transceivers 516a, 518a coupled to 64-bit data channels D1, D0, respectively. In addition, the memory device die 506a includes two multiplexers 520a, 522a for selectively coupling 11-bit control/address channels CA0, CA1 to the respective groups of odd and even memory banks 512a, 514a, and two multiplexers 524a, 526a for selectively coupling the groups of odd and even memory banks 512a, 514a to the transceivers 516a, 518a, respectively.

In the illustrated embodiment of the memory device die 506a, the group of odd memory banks 512a is selectively coupled, by the multiplexer 520a, to the 11-bit control/address channel CA0, and the group of even memory banks 514a is selectively coupled, by the multiplexer 522a, to the 11-bit control/address channel CA0. The groups of odd and even memory banks 512a, 514a are also each selectively coupled, by the multiplexer 526a, to the transceiver 518a, which, in turn, is coupled to the 64-bit data channel D0. In the embodiment illustrated in FIG. 5a, the multiplexer 524a is effectively deactivated, and therefore does not pass any data from the groups of odd and even memory banks 512a, 514a to the transceiver 516a, which, as described above, is coupled to the 64-bit data channel D1. The memory device die 506a of FIG. 5a is therefore configured to deliver all of its bandwidth over the single 64-bit data channel D0.

As shown in FIG. 5b, the alternative embodiment 500b includes a single memory device die 506b having one, two, or more groups of memory banks, such as a group of odd memory banks 512b and a group of even memory banks 514b. The memory device die 506b further includes two transceivers 516b, 518b coupled to 64-bit data channels D1, D0, respectively. In addition, the memory device die 506b includes two multiplexers 520b, 522b for selectively coupling 11-bit control/address channels CA0, CA1 to the respective groups of odd and even memory banks 512b, 514b, and two multiplexers 524b, 526b for selectively coupling the groups of odd and even memory banks 512b, 514b to the transceivers 516b, 518b, respectively.

In the illustrated embodiment of the memory device die 506b, the group of odd memory banks 512b is selectively coupled, by the multiplexer 520b, to the 11-bit control/address channel CA1, and the group of even memory banks 514b is selectively coupled, by the multiplexer 522b, to the 11-bit control/address channel CA0. The group of odd memory banks 512b is also selectively coupled, by the multiplexer 524b, to the transceiver 516b, which, in turn, is coupled to the 64-bit data channel D1. The group of even memory banks 514b is also selectively coupled, by the multiplexer 526b, to the transceiver 518b, which, in turn, is coupled to the 64-bit data channel D0. The memory device die 506b of FIG. 5b is therefore configured to deliver half of its bandwidth from the group of odd memory banks 512b over the 64-bit data channel D1, and to deliver half of its bandwidth from the group of even memory banks 514b over the 64-bit data channel D0.

As shown in FIG. 5c, the alternative embodiment 500c is a two-rank memory stack (Rank 0, Rank 1) that includes two pairs of stacked memory device dice 506c.0, 506c.1 and 506c.2, 506c.3, in which each pair of stacked memory device dice 506c.0, 506c.1 and 506c.2, 506c.3 is configured like the stacked memory device dice 206.0, 206.1 of FIG. 2b. As shown in FIG. 5c, the groups of odd and even memory banks 512c.0, 514c.0 within the memory device die 506c.0 are selectively coupled by respective multiplexers 520c.0, 522c.0 to an 11-bit control/address channel CA0, and the groups of odd and even memory banks 512c.1, 514c.1 within the memory device die 506c.1 are selectively coupled by respective multiplexers 520c.1, 522c.1 to an 11-bit control/address channel CA1. Likewise, the groups of odd and even memory banks 512c.2, 514c.2 within the memory device die 506c.2 are selectively coupled by respective multiplexers 520c.2, 522c.2 to the 11-bit control/address channel CA0, and the groups of odd and even memory banks 512c.3, 514c.3 within the memory device die 506c.3 are selectively coupled by respective multiplexers 520c.3, 522c.3 to the 11-bit control/address channel CA1. The groups of odd and even memory banks 512c.0, 514c.0 within the memory device die 506c.0 are also selectively coupled by a multiplexer 524c.0 and transceiver 516c.0 to a 64-bit data channel D0, and the groups of odd and even memory banks 512c.1, 514c.1 within the memory device die 506c.1 are also selectively coupled by a multiplexer 524c.1 and transceiver 516c.1 to a 64-bit data channel D1. Likewise, the groups of odd and even memory banks 512c.2, 514c.2 within the memory device die 506c.2 are also selectively coupled by a multiplexer 524c.2 and transceiver 516c.2 to the 64-bit data channel D0, and the groups of odd and even memory banks 512c.3, 514c.3 within the memory device die 506c.3 are also selectively coupled by a multiplexer 524c.3 and transceiver 516c.3 to the 64-bit data channel D1. The memory device die 506c of FIG. 5c is therefore configured to deliver half of its bandwidth from the groups of odd and even memory banks 512c.0, 514c.0 and 512c.2, 514c.2 within the respective memory device dice 506c.0, 506c.2 over the 64-bit data channel D0, and to deliver half of its bandwidth from the groups of odd and even memory banks 512c.1, 514c.1 and 512c.3, 514c.3 within the respective memory device dice 506c.1, 506c.3 over the 64-bit data channel D1.

Figure 6:
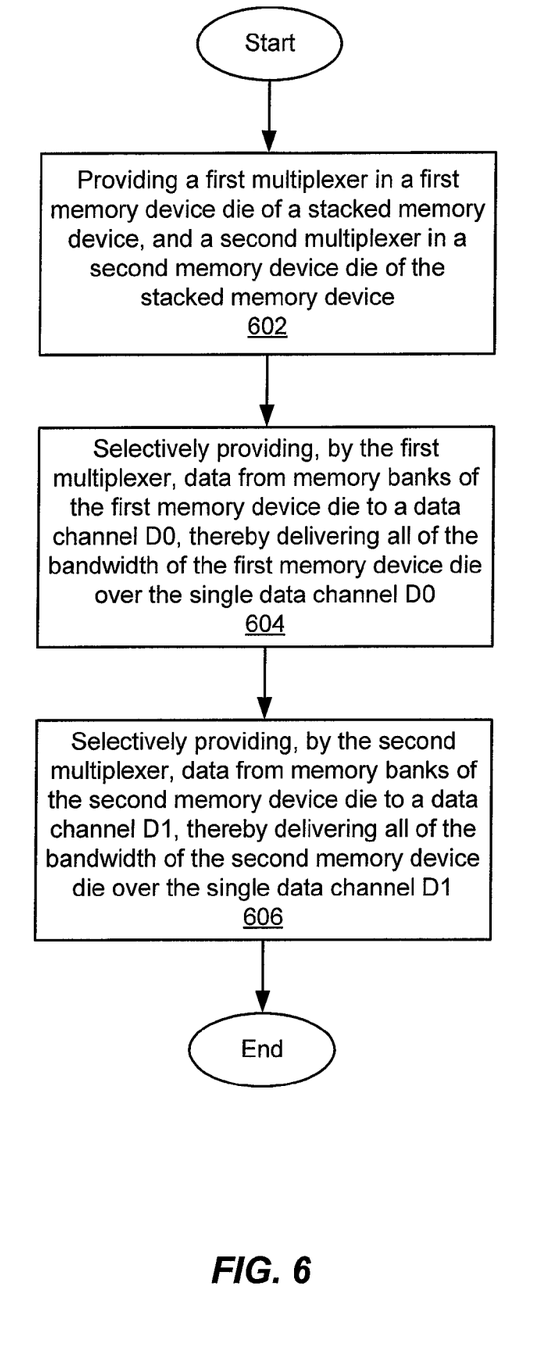

A method of operating the system memory 200 including the stacked first and second memory device dice 206.0, 206.1 is described below with reference to FIGS. 2a, 2b, and 6. As depicted in block 602 (see FIG. 6), a first multiplexer, such as the multiplexer 224.0 (see FIG. 2b), is provided in a first memory device die, such as the memory device die 206.0 (see FIGS. 2a and 2b), and a second multiplexer, such as the multiplexer 224.1 (see FIG. 2b), is provided in a second memory device die, such as the second memory device die 206.1 (see FIGS. 2a and 2b). As depicted in block 604, data from the odd and even memory banks 212.0, 214.0 of the first memory device die 206.0 are selectively provided, by the first multiplexer 224.0, to the 64-bit data channel D0, thereby delivering all of the bandwidth of the first memory device die 206.0 over the single 64-bit data channel D0. As depicted in block 606, data from the odd and even memory banks 212.1, 214.1 of the second memory device die 206.1 are selectively provided, by the second multiplexer 224.1, to the 64-bit data channel D1, thereby delivering all of the bandwidth of the second memory device die 206.1 over the single 64-bit data channel D1.

In accordance with the exemplary embodiments of the disclosed apparatus and methods described herein, a first embodiment of a stacked memory device is provided that includes at least a first memory device die and a second memory device die, in which the first memory device die is stacked onto the second memory device die. Each of the first and second memory device dice includes at least a first memory bank and a second memory bank, and at least a first data channel and a second data channel. Each of the first and second data channels is selectively coupleable to the first memory bank and the second memory bank included in the first memory device die, and selectively coupleable to the first memory bank and the second memory bank included in the second memory device die. The first and second memory banks included in the first memory device die are each operative to provide data to a first one of the first and second data channels, and the first and second memory banks included in the second memory device die are each operative to provide data to a second one of the first and second data channels.

In one aspect, each of the first and second memory device dice further includes a first multiplexer. The first multiplexer included in the first memory device die is operative to selectively provide the data from the first and second memory banks of the first memory device die to the first one of the first and second data channels, and the first multiplexer included in the second memory device die is operative to selectively provide the data from the first and second memory banks of the second memory device die to the second one of the first and second data channels. The first multiplexer included in the first memory device die is further operative to selectively provide the data from the first and second memory banks of the first memory device die to the first one of the first and second data channels in an alternating fashion. Likewise, the first multiplexer included in the second memory device die is further operative to selectively provide the data from the first and second memory banks of the second memory device die to the second one of the first and second data channels in an alternating fashion.

In a further aspect, each of the first and second memory device dice further includes a first transceiver. The first transceiver included in the first memory device die is coupled between the first multiplexer of the first memory device die and the first one of the first and second data channels, and the first transceiver included in the second memory device die is coupled between the first multiplexer of the second memory device die and the second one of the first and second data channels.

In another aspect, each of the first and second memory device dice further includes a second multiplexer. The second multiplexer included in the first memory device die is operative to selectively provide data from the first and second memory banks of the first memory device die to the second one of the first and second data channels, and the second multiplexer included in the second memory device die is operative to selectively provide data from the first and second memory banks of the second memory device die to the first one of the first and second data channels. Each of the first and second memory device dice further includes a second transceiver. The second transceiver included in the first memory device die is coupled between the second multiplexer of the first memory device die and the second one of the first and second data channels, and the second transceiver included in the second memory device die is coupled between the second multiplexer of the second memory device die and the first one of the first and second data channels. For each of the first and second memory device dice, the first and second transceivers each have an associated drive capacity, and the drive capacity associated with the first transceiver is at least about twice the drive capacity associated with the second transceiver.

In still another aspect, the stacked memory device further includes at least a first control and address channel and a second control and address channel. Each of the first and second control and address channels is selectively coupleable to the first memory bank and the second memory bank included in the first memory device die, and selectively coupleable to the first memory bank and the second memory bank included in the second memory device die. Each of the first and second memory device dice further includes a third multiplexer. The third multiplexer included in the first memory device die is operative to selectively provide control and address commands from a first one of the first and second control and address channels to the first memory bank of the first memory device die, and the third multiplexer included in the second memory device die is operative to selectively provide control and address commands from a second one of the first and second control and address channels to the first memory bank of the second memory device die. Each of the first and second memory device dice further includes a fourth multiplexer. The fourth multiplexer included in the first memory device die is operative to selectively provide control and address commands from the first one of the first and second control and address channels to the second memory bank of the first memory device die, and the fourth multiplexer included in the second memory device die is operative to selectively provide control and address commands from the second one of the first and second control and address channels to the second memory bank of the second memory device die.

In yet another aspect, a computer system is provided that includes a system bus, a display communicably coupled to the system bus, a memory controller communicably coupled to the system bus, and the stacked memory device configured in accordance with this first embodiment, in which the memory controller is operative to control the stacked memory device. In this first embodiment, the first and second memory device die can each be configured as one of a dynamic random access memory (DRAM) and a static random access memory (SRAM).

In a second embodiment, a stackable memory device die is provided that includes at least a first memory bank and a second memory bank, and at least a first data channel and a second data channel. Each of the first and second data channels is selectively coupleable to the first memory bank and the second memory bank, and the first and second memory banks are each operative to provide data to the same one of the first and second data channels.

In one aspect, the memory device die further includes a first multiplexer operative to selectively provide the data from the first and second memory banks to the same one of the first and second data channels. The first multiplexer is further operative to selectively provide the data from the first and second memory banks to the same one of the first and second data channels in an alternating fashion. In another aspect, the memory device die further includes a first transceiver coupled between the first multiplexer and the same one of the first and second data channels.

In still another aspect, the memory device die further includes a second multiplexer operative to selectively provide data from the first and second memory banks to the other one of the first and second data channels, and a second transceiver coupled between the second multiplexer and the other one of the first and second data channels. The first and second transceivers each have an associated drive capacity, and the drive capacity associated with the first transceiver can be at least about twice the drive capacity associated with the second transceiver.

In a further aspect, the memory device die further includes at least a first control and address channel and a second control and address channel. Each of the first and second control and address channels is selectively coupleable to the first memory bank and the second memory bank. The memory device die further includes a third multiplexer operative to selectively provide control and address commands from one of the first and second control and address channels to the first memory bank, and a fourth multiplexer operative to selectively provide control and address commands from one of the first and second control and address channels to the second memory bank.

In this second embodiment, the memory device die can be configured as one of a dynamic random access memory (DRAM) and a static random access memory (SRAM).

In a third embodiment, in a stacked memory device including at least a first memory device die stacked onto a second memory device die, and at least a first data channel and a second data channel, in which the first and second memory device dice each include at least a first memory bank and a second memory bank, a method of providing data to the respective first and second data channels is provided that includes providing a first multiplexer in each of the first and second memory device dice, selectively providing, by the first multiplexer in the first memory device die, data from the first and second memory banks of the first memory device die to a first one of the first and second data channels, and selectively providing, by the first multiplexer in the second memory device die, data from the first and second memory banks of the second memory device die to a second one of the first and second data channels.

In one aspect, the selectively providing of the data from the first and second memory banks of the first memory device die to the first one of the first and second data channels includes selectively providing the data from the first and second memory banks of the first memory device die to the first one of the first and second data channels in an alternating fashion, and the selectively providing of the data from the first and second memory banks of the second memory device die to the second one of the first and second data channels includes selectively providing the data from the first and second memory banks of the second memory device die to the second one of the first and second data channels in an alternating fashion.

In a further aspect, the method further includes providing a second multiplexer in each of the first and second memory device dice, selectively providing, by the second multiplexer in the first memory device die, data from the first and second memory banks of the first memory device die to the second one of the first and second data channels, and selectively providing, by the second multiplexer in the second memory device die, data from the first and second memory banks of the second memory device die to the first one of the first and second data channels.

In another aspect, the stacked memory device further includes at least a first control and address channel and a second control and address channel, and the method further includes providing a third multiplexer in each of the first and second memory device dice, selectively providing, by the third multiplexer in the first memory device die, control and address commands from a first one of the first and second control and address channels to the first memory bank of the first memory device die, and selectively providing, by the third multiplexer in the second memory device die, control and address commands from a second one of the first and second control and address channels to the first memory bank of the second memory device die.

In still another aspect, the method further includes providing a fourth multiplexer in each of the first and second memory device dice, selectively providing, by the fourth multiplexer in the first memory device die, control and address commands from the first one of the first and second control and address channels to the second memory bank of the first memory device die, and selectively providing, by the fourth multiplexer in the second memory device die, control and address commands from the second one of the first and second control and address channels to the second memory bank of the second memory device die.

In a fourth embodiment, a stackable memory device die is provided that includes at least a first memory bank and a second memory bank, at least a first data channel and a second data channel, and first means for selectively providing data from one or both of the first and second memory banks to a same one of the first and second data channels. The first means for selectively providing data is operative to selectively provide the data from the first and second memory banks to the same one of the first and second data channels in an alternating fashion.

In one aspect, the memory device die further includes first means for transceiving data coupled between the first means for selectively providing data and the same one of the first and second data channels, second means for selectively providing data from one or both of the first and second memory banks to the other one of the first and second data channels, and second means for transceiving data coupled between the second means for selectively providing data and the other one of the first and second data channels. The first and second means for transceiving data each have an associated drive capacity, and the drive capacity associated with the first means for transceiving data can be at least about twice the drive capacity associated with the second means for transceiving data.

In a further aspect, the memory device die further includes at least a first control and address channel and a second control and address channel, first means for selectively providing control and address commands from one of the first and second control and address channels to the first memory bank, and second means for selectively providing control and address commands from one of the first and second control and address channels to the second memory bank.

In this fourth embodiment, the memory device die can be configured as one of a dynamic random access memory (DRAM) and a static random access memory (SRAM).

In a fifth embodiment, a computer-readable storage medium is provided that includes executable instructions for providing data to a first data channel and a second data channel of a stacked memory device, in which the stacked memory device includes at least a first memory device die stacked onto a second memory device die. The first and second memory device dice each include at least a first memory bank and a second memory bank, and at least a first multiplexer and a second multiplexer. The computer-readable storage medium includes executable instructions to selectively provide, by the first multiplexer in the first memory device die, data from the first and second memory banks of the first memory device die to a first one of the first and second data channels, and to selectively provide, by the first multiplexer in the second memory device die, data from the first and second memory banks of the second memory device die to a second one of the first and second data channels.

In one aspect, the computer-readable storage medium further includes executable instructions to selectively provide the data from the first and second memory banks of the first memory device die to the first one of the first and second data channels in an alternating fashion, and to selectively provide the data from the first and second memory banks of the second memory device die to the second one of the first and second data channels in an alternating fashion.

In another aspect, the computer-readable storage medium further includes executable instructions to selectively provide, by the second multiplexer in the first memory device die, data from the first and second memory banks of the first memory device die to the second one of the first and second data channels, and to selectively provide, by the second multiplexer in the second memory device die, data from the first and second memory banks of the second memory device die to the first one of the first and second data channels.

The foregoing description of exemplary embodiments is provided for purposes of illustration, and is not intended to be exhaustive or to limit the present application to the precise form disclosed. Modifications and variations are possible in light of the teachings herein, or may be acquired from practice of the claimed invention. For example, while a series of operations has been described herein with reference to FIG. 6, the order of the operations may be modified in other implementations. Further, non-dependent operations may be performed in parallel.

It will be apparent that one or more embodiments described herein may be implemented, at least in part, in many different forms of software and/or hardware. Software code and/or specialized hardware used to implement embodiments described herein is not limiting of the claimed invention. Thus, the operation and behavior of some embodiments were described herein without reference to the specific software code and/or the specialized hardware, it being understood that one of ordinary skill in the art would be able to design software and/or hardware to implement the embodiments based on the description herein. Further, certain features of the claimed invention may be implemented using computer-executable instructions that may be executed by a processor or processing logic.

It is noted that FIG. 4 illustrates an exemplary embodiment of the computer system 400, and that other embodiments of the computer system 400 may include more or fewer apparatus components than the apparatus components illustrated in FIG. 4. Further, the apparatus components may be arranged differently than as illustrated in FIG. 4. In addition, functions performed by various apparatus components contained in other embodiments of the computer system 400 may be distributed among the respective components differently than as described herein.

No element, operation, or instruction employed herein should be construed as critical or essential to the application unless explicitly described as such. Also, as employed herein, the article "a" is intended to include one or more items. Where only one item is intended, the term "one" or similar language is employed. Further, the phrase "based on" is intended to mean "based, at least in part, on" unless explicitly stated otherwise.

It is intended that the application not be limited to the particular embodiments disclosed herein, but that the application will include any and all particular embodiments and equivalents falling within the scope of the following appended claims.

What is claimed is:

1. A stacked memory device, comprising:
   at least a first data channel and a second data channel;
   at least a first memory device die and a second memory device die, the first memory device die being stacked onto the second memory device die, each of the first and second memory device dice including at least a first memory bank and a second memory bank, and at least a first data channel portion and a second data channel portion; and
   at least a first die-to-die connection and a second die-to-die connection, the first die-to-die connection being operative to connect the respective first data channel portions included in the first and second memory device dice to form the first data channel, the second die-to-die connection being operative to connect the respective second data channel portions included in the first and second memory device dice to form the second data channel,
   wherein each of the so formed first and second data channels is selectively coupleable to the first memory bank and the second memory bank included in the first memory device die, and selectively coupleable to the first memory bank and the second memory bank included in the second memory device die, and
   wherein the first and second memory banks included in the first memory device die are each operative to provide data to a first one of the so formed first and second data channels, and the first and second memory banks included in the second memory device die are each operative to provide data to a second one of the so formed first and second data channels.

2. The device of claim 1 wherein each of the first and second memory device dice further includes a first multiplexer, the first multiplexer included in the first memory device die being operative to selectively provide the data from the first and second memory banks of the first memory device die to the first one of the first and second data channels, the first multiplexer included in the second memory device die being operative to selectively provide the data from the first and second memory banks of the second memory device die to the second one of the first and second data channels.

3. The device of claim 2 wherein the first multiplexer included in the first memory device die is further operative to selectively provide the data from the first and second memory banks of the first memory device die to the first one of the first and second data channels in an alternating fashion, and wherein the first multiplexer included in the second memory device die is further operative to selectively provide the data from the first and second memory banks of the second memory device die to the second one of the first and second data channels in an alternating fashion.

4. The device of claim 2 wherein each of the first and second memory device dice further includes a first transceiver, the first transceiver included in the first memory device die being coupled between the first multiplexer of the first memory device die and the first one of the first and second data channels, the first transceiver included in the second memory device die being coupled between the first multiplexer of the second memory device die and the second one of the first and second data channels.

5. The device of claim 4 wherein each of the first and second memory device dice further includes a second multiplexer, the second multiplexer included in the first memory device die being operative to selectively provide data from the first and second memory banks of the first memory device die to the second one of the first and second data channels, the second multiplexer included in the second memory device die being operative to selectively provide data from the first and second memory banks of the second memory device die to the first one of the first and second data channels.

6. The device of claim 5 wherein each of the first and second memory device dice further includes a second transceiver, the second transceiver included in the first memory device die being coupled between the second multiplexer of the first memory device die and the second one of the first and second data channels, the second transceiver included in the second memory device die being coupled between the second multiplexer of the second memory device die and the first one of the first and second data channels.

7. The device of claim 6 wherein, for each of the first and second memory device dice:
the first and second transceivers each have an associated drive capacity; and
the drive capacity associated with the first transceiver is at least about twice the drive capacity associated with the second transceiver.

8. The device of claim 1 further comprising:
at least a first control and address channel and a second control and address channel, each of the first and second control and address channels being selectively coupleable to the first memory bank and the second memory bank included in the first memory device die, and selectively coupleable to the first memory bank and the second memory bank included in the second memory device die.

9. The device of claim 8 wherein each of the first and second memory device dice further includes a third multiplexer, the third multiplexer included in the first memory device die being operative to selectively provide control and address commands from a first one of the first and second control and address channels to the first memory bank of the first memory device die, the third multiplexer included in the second memory device die being operative to selectively provide control and address commands from a second one of the first and second control and address channels to the first memory bank of the second memory device die.

10. The device of claim 8 wherein each of the first and second memory device dice further includes a fourth multiplexer, the fourth multiplexer included in the first memory device die being operative to selectively provide control and address commands from the first one of the first and second control and address channels to the second memory bank of the first memory device die, the fourth multiplexer included in the second memory device die being operative to selectively provide control and address commands from the second one of the first and second control and address channels to the second memory bank of the second memory device die.

11. The device of claim 1 wherein the first and second memory device die are each configured as one of a dynamic random access memory (DRAM) and a static random access memory (SRAM).

12. A stackable memory device die, comprising:
at least a first memory bank and a second memory bank;
at least a first data channel and a second data channel, each of the first and second data channels being selectively coupleable to the first memory bank and the second memory bank,
wherein the first and second memory banks are each operative to provide data to a same one of the first and second data channels;
a first multiplexer operative to selectively provide the data from the first and second memory banks to the same one of the first and second data channels; and
a first transceiver coupled between the first multiplexer and the same one of the first and second data channels.

13. The memory device die of claim 12 wherein the first multiplexer is further operative to selectively provide the data from the first and second memory banks to the same one of the first and second data channels in an alternating fashion.

14. The memory device die of claim 12 further comprising:
a second multiplexer operative to selectively provide data from the first and second memory banks to the other one of the first and second data channels; and
a second transceiver coupled between the second multiplexer and the other one of the first and second data channels.

15. The memory device die of claim 14 wherein the first and second transceivers each have an associated drive capacity, and wherein the drive capacity associated with the first transceiver is at least about twice the drive capacity associated with the second transceiver.

16. The memory device die of claim 12 further comprising:
at least a first control and address channel and a second control and address channel, each of the first and second control and address channels being selectively coupleable to the first memory bank and the second memory bank.

17. The memory device die of claim 16 further comprising:
a third multiplexer operative to selectively provide control and address commands from one of the first and second control and address channels to the first memory bank; and
a fourth multiplexer operative to selectively provide control and address commands from one of the first and second control and address channels to the second memory bank.

18. The memory device die of claim 12 wherein the memory device die is configured as one of a dynamic random access memory (DRAM) and a static random access memory (SRAM).

19. In a stacked memory device including at least a first memory device die stacked onto a second memory device die, and at least a first data channel and a second data channel, the first and second memory device dice each including at least a first memory bank and a second memory bank, and at least a first data channel portion and a second data channel portion, a method of providing data to the respective first and second data channels, comprising:
providing at least a first die-to-die connection and a second die-to-die connection;
connecting, by the first die-to-die connection, the respective first data channel portions included in the first and second memory device dice to form the first data channel;
connecting, by the second die-to-die connection, the respective second data channel portions included in the first and second memory device dice to form the second data channel;
providing a first multiplexer in each of the first and second memory device dice;
selectively providing, by the first multiplexer in the first memory device die, data from the first and second memory banks of the first memory device die to a first one of the so formed first and second data channels; and
selectively providing, by the first multiplexer in the second memory device die, data from the first and second memory banks of the second memory device die to a second one of the so formed first and second data channels.

20. The method of claim 19 wherein the selectively providing of the data from the first and second memory banks of the first memory device die to the first one of the first and second data channels includes selectively providing the data from the first and second memory banks of the first memory device die to the first one of the first and second data channels in an alternating fashion, and wherein the selectively providing of the data from the first and second memory banks of the second memory device die to the second one of the first and second data channels includes selectively providing the data from the first and second memory banks of the second memory device die to the second one of the first and second data channels in an alternating fashion.

21. The method of claim 19 further comprising:
providing a second multiplexer in each of the first and second memory device dice;
selectively providing, by the second multiplexer in the first memory device die, data from the first and second memory banks of the first memory device die to the second one of the first and second data channels; and
selectively providing, by the second multiplexer in the second memory device die, data from the first and second memory banks of the second memory device die to the first one of the first and second data channels.

22. A computer-readable storage medium including executable instructions for providing data to a first data channel and a second data channel of a stacked memory device, the stacked memory device including at least a first memory device die stacked onto a second memory device die, the first and second memory device dice each including at least a first memory bank and a second memory bank, at least a first data channel portion and a second data channel portion, and at least a first multiplexer and a second multiplexer, the computer-readable storage medium comprising executable instructions:
to selectively provide, by the first multiplexer in the first memory device die, data from the first and second memory banks of the first memory device die to a first one of the first and second data channels, the first and second memory device dice each further including at least a first die-to-die connection and a second die-to-die connection, the first die-to-die connection for connecting the respective first data channel portions included in the first and second memory device dice to form the first data channel, the second die-to-die connection for connecting the respective second data channel portions included in the first and second memory device dice to form the second data channel; and
to selectively provide, by the first multiplexer in the second memory device die, data from the first and second memory banks of the second memory device die to a second one of the so formed first and second data channels.

23. The computer-readable storage medium of claim 22 further comprising executable instructions:
to selectively provide the data from the first and second memory banks of the first memory device die to the first one of the first and second data channels in an alternating fashion; and
to selectively provide the data from the first and second memory banks of the second memory device die to the second one of the first and second data channels in an alternating fashion.

* * * * *